United States Patent
Cairoli et al.

(10) Patent No.: US 11,196,415 B2
(45) Date of Patent: Dec. 7, 2021

(54) SYSTEM FOR PROVIDING BI-DIRECTIONAL POWER FLOW AND POWER CONDITIONING FOR LOW TO HIGH-VOLTAGE APPLICATIONS

(71) Applicant: ABB SCHWEIZ AG, Baden (CH)

(72) Inventors: Pietro Cairoli, Raleigh, NC (US); Utkarsh Raheja, Raleigh, NC (US); Thiago-Batista Soeiro, Ev Schipluiden (NL); Lukas Hofstetter, Basel (CH); Matthias Bator, Klettgau (DE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/029,875

(22) Filed: Sep. 23, 2020

(65) Prior Publication Data
US 2021/0091767 A1  Mar. 25, 2021

(30) Foreign Application Priority Data
Sep. 24, 2019  (EP) ..................................... 19306183

(51) Int. Cl.
*H03K 17/687* (2006.01)
*H03K 17/567* (2006.01)

(52) U.S. Cl.
CPC ................... *H03K 17/567* (2013.01)

(58) Field of Classification Search
CPC .................................................. H03K 17/567
USPC ......................................................... 327/430
See application file for complete search history.

(56) References Cited

U.S. PATENT DOCUMENTS

| | | | |
|---|---|---|---|
| 6,483,369 B1 | 11/2002 | Wittenbreder, Jr. | |
| 7,324,315 B2* | 1/2008 | Harris | H02H 9/025 361/58 |
| 7,616,418 B2* | 11/2009 | Harris | H02H 9/025 361/58 |
| 2008/0048806 A1 | 2/2008 | Maier et al. | |
| 2008/0123232 A1* | 5/2008 | Harris | H02H 9/025 361/56 |
| 2009/0167411 A1* | 7/2009 | Machida | H01L 29/812 327/427 |
| 2011/0102054 A1* | 5/2011 | Domes | H01L 24/49 327/419 |
| 2012/0287688 A1* | 11/2012 | Fornage | H03K 17/693 363/123 |
| 2014/0225163 A1 | 8/2014 | Briere | |

(Continued)

FOREIGN PATENT DOCUMENTS

WO       2012154974 A1    11/2012

OTHER PUBLICATIONS

Alex Q. Huang et al.: "5kV/40A Freedom Super-Cascode: A Cost Effective SiC Hight Voltage and High Frequency Power Switch Xiaoqing Song 1)"; Sep. 18, 2016.

(Continued)

*Primary Examiner* — Metasebia T Retebo
(74) *Attorney, Agent, or Firm* — Cantor Colburn LLP

(57) ABSTRACT

A system for providing bi-directional power flow and power conditioning for high-voltage applications. The system including a normally-off four-quadrant power electronic switch having two gates and two normally-on junction field-effect transistor. The normally-off four-quadrant power electronic switch and the two normally-on junction field-effect transistors are coupled to one another in a bi-cascode configuration.

20 Claims, 2 Drawing Sheets

(56) References Cited

U.S. PATENT DOCUMENTS

2014/0346570 A1    11/2014  Ueno
2018/0026570 A1     1/2018  Cairoli et al.
2018/0026623 A1*    1/2018  Cairoli ............... H03K 17/0824
                                                          361/89

OTHER PUBLICATIONS

European Search Report for Application No. EP 19 30 6183.
Jayan Baliga: "Fundamentals of Power Semiconductor Devices" Jan. 1, 2018; pp. 465-466.
Song Xiaoqing et al.: "Comparative evaluation of 6kV Si and SiC power devices for medium voltage power electronics applications"; 2015 IEEE 3rd Workshop on Wide Bandgap Power Devices and Applications (WIPDA), Nov. 2, 2015; pp. 150-155.
Written Opinion for Application No. EP 19 30 6183.

* cited by examiner

SYSTEM FOR PROVIDING BI-DIRECTIONAL POWER FLOW AND POWER CONDITIONING FOR LOW TO HIGH-VOLTAGE APPLICATIONS

CROSS REFERENCE TO RELATED APPLICATIONS

This application claims priority under 35 U.S.C. § 119 to the following European Patent Application No. EP 19306183.5, filed on Sep. 24, 2019, the entire contents of which are incorporated herein by reference thereto.

FIELD OF THE INVENTION

The present invention relates to a system for providing bi-directional power flow and power conditioning for high-voltage applications.

PRIOR ART

It is known to use power semiconductor switching devices such as four-quadrant switch to conduct current in both directions and block voltages for both positive and negative polarity.

There exists no single device that has these characteristics, hence four-quadrant switches are usually made up by combining available power electronic devices in suitable manner. For example, an anti-series connection of two MOSFETs (along with their body-diodes) can make a four-quadrant switch.

However, it is known to use bipolar normally-off semiconductors or more evolved cascode structures of normally-on high-voltage JFETs with low voltage normally-off MOSFETs to control the turn-on and turn-off of the cascode.

The document EP2707959A1 describes a fully controlled bidirectional power switches may be utilized in devices such as AC-AC matrix converters to provide the converters with higher operating efficiencies as compared to conventional DC-linked AC-AC converters.

However, these solutions do not give complete satisfaction.

Such a configuration lead to an overall switch with high conduction losses.

The present invention aim to solve the conduction losses problem.

DESCRIPTION OF THE INVENTION

For this purpose, the present invention relates to a system for providing bi-directional power flow and power conditioning for low to high-voltage applications, comprising:
- a normally-off four-quadrant (4Q) power electronic switch having two gates; and
- two normally-on junction field-effect transistor (JFETs);
- wherein the normally-off 4Q switch and the two normally-on JFETs are coupled to one another in a bi-cascode configuration.

Within the meaning of the present invention, low voltage means a voltage lower than 1500V.

Within the meaning of the present invention, high voltage means a voltage greater than 1500V.

Such a configuration, and specifically a normally-off 4Q switch coupled with JFETS allows to achieve a low on-state and switching electrical losses. Indeed an advantage of 4Q switch is that the structure is made such as the active areas are shared between different uses.

Such a configuration, and specifically a normally-off 4Q switch coupled with JFETS allows to achieve a high semiconductor utilization.

Such a configuration, and specifically a normally-off 4Q switch coupled with JFETS allows to achieve a high power density.

In one embodiment, the normally-off 4Q switch is used as control switch for the cascode.

Such a configuration, and more specifically the use of a normally-off 4Q switch as a control switch for the cascode permits to obtain low electrical losses even on high voltage uses.

According to an embodiment, each of the two normally-on JFETs that are coupled to one another with the normally-off 4Q switch are respectively connected in a cascode connection with at least one another normally-on JFETs.

Such a configuration allows to obtain very low on-state and switching electrical losses on high voltage application.

According to an embodiment, the normally-on JFETs are made of silicon carbide (SiC).

According to an embodiment, the normally-on JFETs are made of diamond (C).

According to an embodiment, the normally-on JFETs are made of silicon

According to an embodiment, the normally-off 4Q switch is a monolithic bidirectional power electronic switch.

According to an embodiment, the normally-off 4Q switch comprises a wide bandgap semiconductor material.

Such an embodiment allows the system to be used at high temperatures such as 300° C.

Such an embodiment allows the system to be used at high voltage.

Such an embodiment allows the system to be used at high frequencies.

According to an embodiment, the wide bandgap semiconductor material is aluminum gallium nitride/gallium nitride (AlGaN/GaN).

According to an embodiment, the wide bandgap semiconductor material is silicon carbide (SiC).

According to an embodiment, the wide bandgap semiconductor material is diamond (C).

According to an embodiment, each of the two normally-on JFETs are coupled to one another with the normally-off 4Q switch across a bias circuit (20), such as the bias circuit (20) is configured to ensure that a voltage going across the system is within safe limits.

Such a configuration allows establishing proper operating conditions in electronic components.

According to an embodiment, each bias circuit comprises a Zener Diode (22) mounted in parallel with a capacitor (24) and a resistor (26).

According to an embodiment, the breakdown voltage of the Zener diode is selected to be equal to each of the two normally-on JFETs threshold voltage allowing a first gate-source junction to have a voltage equal to zero. Therefore when the system is gated on, the voltage across it drops to zero as a second gate-source junction discharges through the system and the parallel resistor and capacitor toward zero volt allowing to turn on a connected device.

According to an embodiment, the parallel resistor and capacitor have a capacitance that allows a low impedance path during a switching transition, enabling a faster turn-on of a connected device.

Such a configuration allows a smaller current requirement than during a switch transient and therefore allows the resistor to be of the order of few Kilo-Ohms.

According to an embodiment, the higher the value of the electrical resistance of the resistor is, the more it ensure that the leakage current remains within acceptable limits.

According to an embodiment, each bias circuit comprises a Zener Diode mounted in series with a capacitor itself mounted in parallel with a resistor.

According to an embodiment, the resistor and capacitor have a capacitance that allows a low impedance path during a switching transition, enabling a faster turn-on of a connected device.

According to an embodiment, the Zener diode is connected across gate-source junction and therefore allows to clamp a turn-off voltage to a threshold and limit an on-state gate-source voltage of the two normally-off JFETs to a forward drop of said Zener diode.

According to an embodiment, even though the capacitor across the resistor helps to speed-up the switching transition the high value of the resistor has a negative impact on the switching speed as well as the off-state leakage current. Moreover, since the capacitor is active during the switching transition, there is a reduced control over the speed of the switching transition.

According to an embodiment, each bias circuit comprises a N-type metal-oxide-semiconductor logic (NMOS).

Such an embodiment allows to conduct electrons between n-type "source" and "drain" terminals.

According to an embodiment, each bias circuit comprises a Zener Diode mounted in parallel with the NMOS and a resistor mounted in series with said NMOS.

According to an embodiment, when the system is gated off, a first NMOS is turned off, blocking the voltage across the respective parallel Zener diode. Thus, there is no bias current requirement for the respective series resistor.

Therefore, the resistance value of the respective series resistor can be kept low or it can be removed altogether for maximum switching speed. Such an embodiment ensures a very low impedance discharge path to the gate-source capacitance during the turn-on transition, posing no limitation on the turn-on speed.

According to an embodiment, the capacitor across the Zener diode and resistor in can also be removed.

According to an embodiment, the NMOS device gates can be connected to the corresponding gates of the system. This means that there are no auxiliary circuit requirements due to the active NMOS switching devices. Thus, it can be utilized like other 4-quadrant device configurations, with the added advantage of reduced losses and better semiconductor utilization, as explained before.

According to an embodiment, the resistance of each of the resistor allows the control of the switching transition based on the application requirements. Resistance values smaller than 10 Ohm for example can be selected for high frequency speed applications.

Resistance values bigger than 100 Ohm for example can be selected for electrical apparatus applications where there is the desire to slow down the switching transient to minimize the stress on the system components.

According to an embodiment, the NMOS device is low-voltage, low-current which is very simple to mount and use.

According to an embodiment, the system is able to be used in several applications such as photovoltaic inverters, motor drives, uninterruptible power supply of data center for example.

The different aspects defined above that are not incompatible can be combined.

SHORT DESCRIPTION OF THE DRAWINGS

The invention will be better understood by means of the detailed description which is set out below with reference to the appended drawings in which.

DETAILED DESCRIPTION

Figure 2:
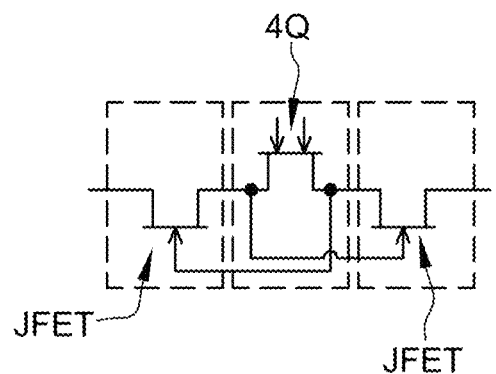
FIG. 2 shows a system in a cascode configuration in accordance with the present invention.

FIG. 2 relates to a system for providing bi-directional power flow and power conditioning for low to high-voltage applications, comprising a normally-off four-quadrant (4Q) power electronic switch having two gates.

Within the meaning of the present invention, low voltage means a voltage lower than 1500V.

Within the meaning of the present invention, high voltage means a voltage greater than 1500V.

Figure 1:
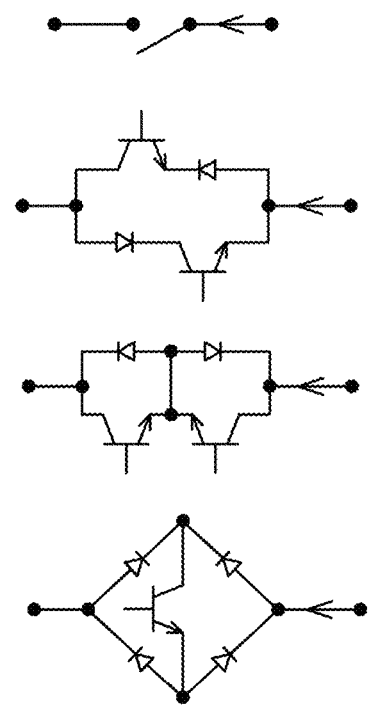
FIG. 1 shows embodiments of four-quadrant power electronic switch in accordance with the present invention.

Some examples of possible embodiments for 4Q switch are shown in FIG. 1.

According to an embodiment, the normally-off 4Q switch is a monolithic bidirectional power electronic switch. Such a configuration reduce the losses of the system.

According to an embodiment, the normally-off 4Q switch comprises a wide bandgap semiconductor material.

Such an embodiment allows the system to be used at high temperatures such as 300° C.

Such an embodiment allows the system to be used at high voltage.

Such an embodiment allows the system to be used at high frequencies.

According to an embodiment, the wide bandgap semiconductor material is aluminum gallium nitride/gallium nitride (AlGaN/GaN), the wide bandgap semiconductor material is silicon carbide (SiC), or the wide bandgap semiconductor material is diamond (C) for example.

The system also comprises two normally-on junction field-effect transistor (JFETs) wherein the normally-off 4Q switch and the two normally-off JFETs are coupled to one another in a bi-cascode configuration. The normally-off 4Q switch is used as control switch for the cascode.

Such a configuration, and more specifically the use of a normally-off 4Q switch as a control switch for the cascode permits to obtain low electrical losses even on high voltage uses.

Such a configuration, and specifically a normally-off 4Q switch coupled with JFETs allows to achieve a low on-state and switching electrical losses. Indeed an advantage of 4Q switch is that the structure is made such as the active areas are shared between different uses.

Because of the low on-resistance of the JFETs, the resistance of the normally-off 4Q switch is able to increase or even to dominate the overall resistance of the system.

Such a configuration, and specifically a normally-off 4Q switch coupled with JFETs allows to achieve a high semiconductor utilization.

Such a configuration, and specifically a normally-off 4Q switch coupled with JFETs allows to achieve a high power density.

Figure 3:
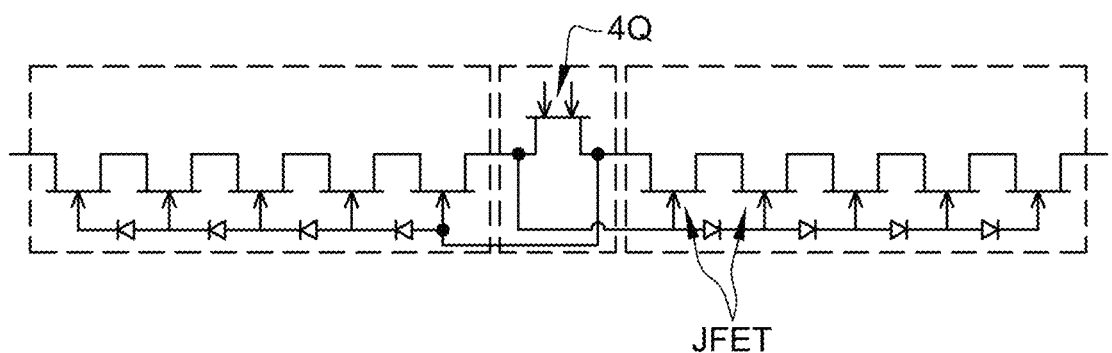
FIG. 3 shows a system in a super-cascode configuration in accordance with the present invention.

In another embodiment, each of the two normally-on JFETs that are coupled to one another with the normally-off 4Q switch are respectively connected in a cascode connection with at least one another normally-on JFETs as shown in FIG. 3.

Such a configuration allows to obtain very low on-state and switching electrical losses on high voltage application.

According to an embodiment, the normally-on JFETs are made of silicon carbide (SiC) or the normally-on JFETs are made of diamond (C) or the normally-on JFETs are made of silicon (Si) for example.

Figure 4:
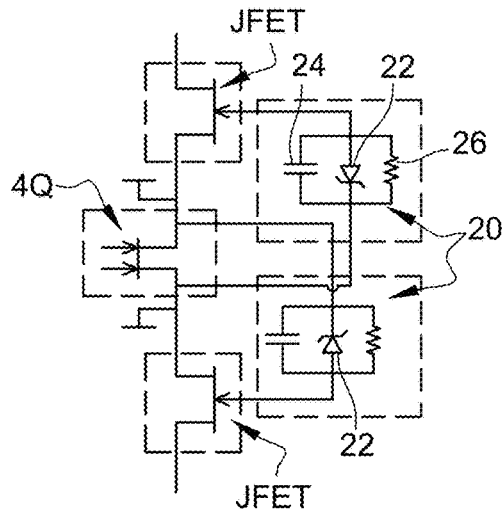
FIG. 4 shows a system comprising a bias circuit having components mounted in parallel in accordance with the present invention.
Figure 5:
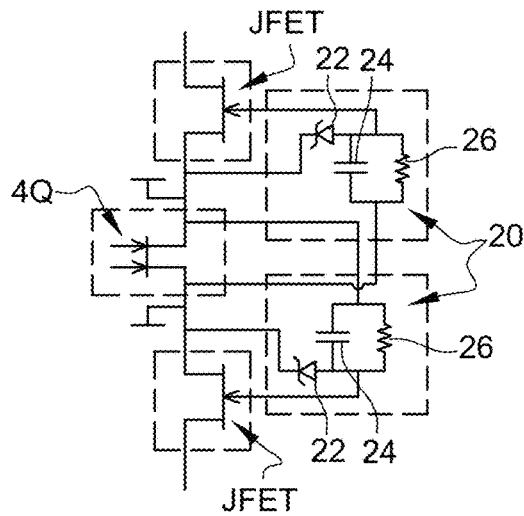
FIG. 5 shows a system comprising a bias circuit having components mounted in series and in parallel in accordance with the present invention.
Figure 6:
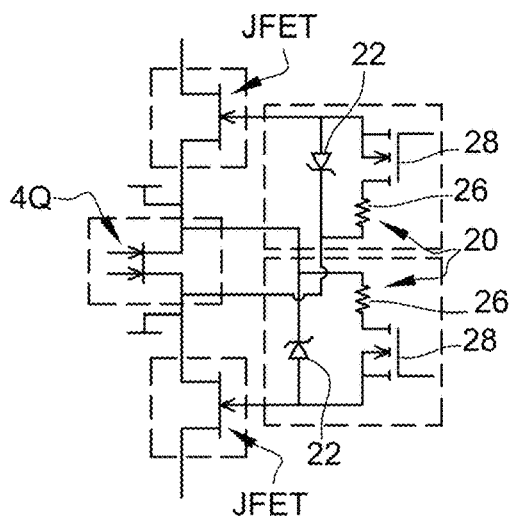
FIG. 6 shows a system comprising a bias circuit having components mounted in series and in parallel in accordance with the present invention.

As show in FIGS. 4, 5 and 6, according to an embodiment, the system wherein each of the two normally-on JFETs are coupled to one another with the normally-off 4Q switch across a bias circuit 20, such as the bias circuit 20 is configured to ensure that a voltage going across the system is within safe limits. Such a configuration ensure reliable operation. Such a configuration allows establishing proper operating conditions in electronic components.

FIG. 4 shows a first example of a bias circuit comprising a Zener Diode 22 mounted in parallel with a capacitor 24 and a resistor 26.

According to an embodiment, the breakdown voltage of the Zener diode 22 is selected to be equal to each of the two normally-on JFETs threshold voltage allowing a first gate-source junction to have a voltage equal to zero.

Therefore, when the system is gated on, the voltage across it drops to zero as a second gate-source junction discharges through the system and the parallel resistor 26 and capacitor 24 toward zero volt allowing to turn on a connected device.

According to an embodiment, the parallel resistor 26 and capacitor 24 have a capacitance that allows a low impedance path during a switching transition, enabling a faster turn-on of a connected device. Such a configuration allows a smaller current requirement than during a switch transient and therefore allows the resistor 26 to be of the order of few Kilo-Ohms.

According to an embodiment, the higher the value of the electrical resistance of the resistor 26 is, the more it ensure that the leakage current remains within acceptable limits.

FIG. 5 shows a second example of a bias circuit 20 comprising a Zener Diode 22 mounted in series with a capacitor 24 itself mounted in parallel with a resistor 26. According to an embodiment, the resistor 26 and capacitor 24 have a capacitance that allows a low impedance path during a switching transition, enabling a faster turn-on of a connected device.

According to an embodiment, the Zener diode 22 is connected across gate-source junction and therefore allows to clamp a turn-off voltage to a threshold and limit an on-state gate-source voltage of the two normally-off JFETs to a forward drop of said Zener diode 22.

According to an embodiment, even though the capacitor across the resistor 26 helps to speed-up the switching transition the high value of the resistor 26 resistance has a negative impact on the switching speed as well as the off-state leakage current. Moreover, since the capacitor 24 is active during the switching transition, there is a reduced control over the speed of the switching transition.

FIG. 6 shows a second example of a bias circuit 20 comprising a Zener Diode 22 mounted in parallel with an N-type metal-oxide-semiconductor logic NMOS 28 and a resistor 26 mounted in series with said NMOS 28. The use of the NMOS allows to conduct electrons between n-type "source" and "drain" terminals.

According to an embodiment, when the system is gated off, a first NMOS 28 is turned off, blocking the voltage across the respective parallel Zener diode 22. Thus, there is no bias current requirement for the respective series resistor 26.

Therefore, the resistance value of the respective series resistor 26 can be kept low or it can be removed altogether for maximum switching speed. Such an embodiment ensures a very low impedance discharge path to the gate-source capacitance during the turn-on transition, posing no limitation on the turn-on speed. Therefore, according to an embodiment, the capacitor across the Zener diode and resistor in can also be removed.

According to an embodiment, the NMOS 28 device gates can be connected to the corresponding gates of the system. This means that there are no auxiliary circuit requirements due to the active NMOS 28 switching devices. Thus, it can be utilized like other 4-quadrant device configurations, with the added advantage of reduced losses and better semiconductor utilization, as explained before.

According to an embodiment, the resistance of each of the resistor 26 allows the control of the switching transition based on the application requirements. Resistance values smaller than 10 Ohm for example can be selected for high frequency speed applications. Resistance values bigger than 100 Ohm for example can be selected for electrical apparatus applications where there is the desire to slow down the switching transient to minimize the stress on the system components.

According to an embodiment, the NMOS 28 device is low-voltage, low-current which is very simple to mount and use.

Figure 7:
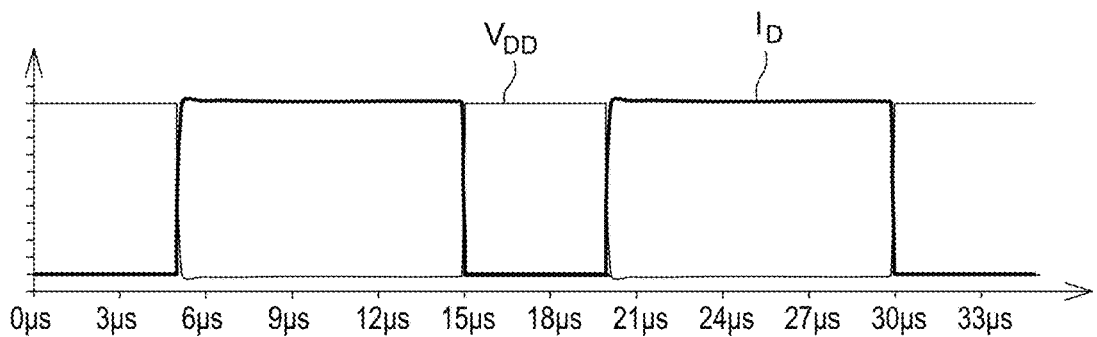
FIG. 7 shows a simulation result of a system in accordance with the present invention.

FIG. 7 shows a switching simulation result of the system according to the embodiment shows in FIG. 6 wherein the bias circuit 20 comprise a Zener Diode 22 mounted in parallel with an N-type metal-oxide-semiconductor logic NMOS 28 and a resistor 26 mounted in series with said NMOS 28.

The simulation shows switching waveforms and more specifically how fast a device connected to the system according to the embodiment shows in FIG. 6 can be turned on and turned off.

Of course, the invention is not limited to the embodiments shown and described above, but covers all variants.

What is claimed is:

1. A system for providing bi-directional power flow and power conditioning for low to high-voltage applications, comprising:
   a normally-off four-quadrant power electronic switch having two gates; and
   two normally-on junction field-effect transistors;
   wherein the normally-off four-quadrant power electronic switch and the two normally-on junction field-effect transistors are coupled to one another in a bi-cascode configuration, wherein the normally-off four-quadrant power electronic switch is coupled in series with each of the two normally-on junction field-effect transistors.

2. The system of claim 1, wherein each of the two normally-on junction field-effect transistors that are coupled to one another with the normally-off four-quadrant power electronic switch are respectively connected in a cascode connection with at least one other normally-on junction field-effect transistor.

3. The system of claim 1, wherein the two normally-on junction field-effect transistors are made of silicon carbide.

4. The system of claim 1, wherein the two normally-on junction field-effect transistors are made of diamond.

5. The system of claim 1, wherein the two normally-on junction field-effect transistors are made of silicon.

6. The system of claim 1, wherein the normally-off four-quadrant power switch is a monolithic bidirectional power electronic switch.

7. The system of claim 1, wherein the normally-off four-quadrant power switch comprises a wide bandgap semiconductor material.

8. The system of claim 7, wherein the wide bandgap semiconductor material is aluminum gallium nitride/gallium nitride.

9. The system of claim 7, wherein the wide bandgap semiconductor material is silicon carbide.

10. The system of claim 7, wherein the wide bandgap semiconductor material is diamond.

11. The system of claim 1, wherein each of the two normally-on junction field-effect transistors are coupled to one another with the normally-off four-quadrant power electronic switch across a bias circuit, wherein the bias circuit is configured to ensure that a voltage going across the system is within a predetermined limit.

12. The system of claim 11, wherein the bias circuit comprises a Zener Diode mounted in parallel with a capacitor and a resistor.

13. The system of claim 11, wherein the bias circuit comprises a Zener Diode mounted in series with a capacitor mounted in parallel with a resistor.

14. The system of claim 11, wherein the bias circuit comprises a N-type metal-oxide-semiconductor logic.

15. The system of claim 14, wherein the bias circuit comprises a Zener Diode mounted in parallel with the N-type metal-oxide-semiconductor logic and a resistor mounted in series with the N-type metal-oxide-semiconductor logic.

16. The system of claim 2, wherein the two normally-on junction field-effect transistors are made of silicon carbide.

17. The system of claim 2, wherein the two normally-on junction field-effect transistors are made of diamond.

18. The system of claim 2, wherein the two normally-on junction field-effect transistors are made of silicon.

19. The system of claim 2, wherein the normally-off four-quadrant power switch is a monolithic bidirectional power electronic switch.

20. The system of claim 2, wherein the normally-off four-quadrant power switch comprises a wide bandgap semiconductor material.

* * * * *